United States Patent
Park et al.

(10) Patent No.: US 9,214,206 B2
(45) Date of Patent: Dec. 15, 2015

(54) METHOD OF TESTING NON-VOLATILE MEMORY DEVICE AND METHOD OF MANAGING NON-VOLATILE MEMORY DEVICE

(71) Applicants: Sang-In Park, Anyang-si (KR); Boh-Chang Kim, Yongin-si (KR); Bu-il Nam, Hwaseong-si (KR); Dong-Ku Kang, Seongnam-si (KR)

(72) Inventors: Sang-In Park, Anyang-si (KR); Boh-Chang Kim, Yongin-si (KR); Bu-il Nam, Hwaseong-si (KR); Dong-Ku Kang, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/468,736

(22) Filed: Aug. 26, 2014

(65) Prior Publication Data
US 2015/0063030 A1 Mar. 5, 2015

(30) Foreign Application Priority Data

Sep. 4, 2013 (KR) .......................... 10-2013-0106305

(51) Int. Cl.
| | |
|---|---|
| *G11C 16/04* | (2006.01) |
| *G11C 8/08* | (2006.01) |
| *G11C 16/08* | (2006.01) |
| *G11C 16/34* | (2006.01) |
| *G11C 29/10* | (2006.01) |
| *G11C 29/44* | (2006.01) |
| *G11C 16/00* | (2006.01) |
| *G11C 29/12* | (2006.01) |

(52) U.S. Cl.
CPC ........ *G11C 8/08* (2013.01); *G11C 16/08* (2013.01); *G11C 16/349* (2013.01); *G11C 29/10* (2013.01); *G11C 29/44* (2013.01); *G11C 16/00* (2013.01); *G11C 2029/1202* (2013.01)

(58) Field of Classification Search
USPC ................ 365/185.12, 185.17, 185.2, 185.28
See application file for complete search history.

(56) References Cited

U.S. PATENT DOCUMENTS

| | | |
|---|---|---|
| 2003/0123286 A1 | 7/2003 | Higuchi |
| 2007/0002638 A1 | 1/2007 | Ohtake et al. |
| 2011/0063918 A1 | 3/2011 | Pei et al. |
| 2012/0002475 A1 | 1/2012 | Ueno et al. |
| 2012/0008410 A1 | 1/2012 | Huynh et al. |
| 2012/0281479 A1 | 11/2012 | Kochar et al. |
| 2013/0088917 A1 | 4/2013 | Park et al. |
| 2013/0148430 A1* | 6/2013 | Shiino et al. ............. 365/185.18 |

* cited by examiner

*Primary Examiner* — Hoai V Ho
(74) *Attorney, Agent, or Firm* — Harness, Dickey & Pierce

(57) ABSTRACT

A method of testing a non-volatile memory device and a method of managing the non-volatile memory device are provided. The method of testing the non-volatile memory device includes calculating first and second values based on program loop frequencies corresponding to word lines of a memory area. A characteristic value of the memory area may be calculated based on the first and second values, and may be compared to a reference value to determine whether the memory area is defective.

20 Claims, 12 Drawing Sheets

METHOD OF TESTING NON-VOLATILE MEMORY DEVICE AND METHOD OF MANAGING NON-VOLATILE MEMORY DEVICE

CROSS-REFERENCE TO RELATED APPLICATIONS

This application claims the benefit of Korean Patent Application No. 10-2013-0106305, filed on Sep. 4, 2013, in the Korean Intellectual Property Office, the disclosure of which is incorporated herein in its entirety by reference.

FIELD

The inventive concepts relate to a method of testing a non-volatile memory device and/or a method of managing the non-volatile memory device, and more particularly, to a method of testing a non-volatile memory device including a memory area and/or a method of managing the non-volatile memory device.

BACKGROUND

A non-volatile memory device may maintain data stored therein even when a power supply is no longer provided. A flash memory device is an example of the non-volatile memory device and may include a memory cell in which data may be electrically written or erased, and the memory cell may include a floating gate transistor. The memory cell may store data by adjusting a threshold voltage of the floating gate transistor.

The threshold voltage of the floating gate transistor may be changed when a high voltage is applied to a gate of the floating gate transistor. The floating gate transistor of the memory cell may be connected to a word line, and the threshold voltage of the floating gate transistor may be changed by a voltage that is applied to the word line.

SUMMARY

At least one example embodiment relates to a method of testing a non-volatile memory device to determine whether a memory area of the non-volatile memory device is defective.

According to an example embodiment, a method of testing a non-volatile memory device is provided. The non-volatile memory device includes a memory area, and the memory area includes memory cells that are connected to a plurality of word lines. The method includes selecting one of a plurality of program loop frequencies as a first value. The plurality of program loop frequencies corresponds to the plurality of word lines. The method includes determining a second value based on a number N of the plurality of program loop frequencies, where the number N is a natural number that is equal to or greater than two. The method includes determining a characteristic value of the memory area based on the first and second values. The method includes determining that the memory area is defective based on a reference value and the characteristic value.

Example embodiments provide that the first value is a maximum frequency selected from among the plurality of program loop frequencies, and the second value is a sum obtained by adding together the number N of the plurality of program loop frequencies.

Example embodiments provide that the characteristic value is obtained by subtracting from the first value a quotient obtained by dividing the second value by N.

Example embodiments provide that the characteristic value is obtained by subtracting the second value from a value obtained by multiplying the first value by N.

Example embodiments provide that the reference value is based on the first value and the second value.

Example embodiments provide that determining whether the memory area is defective includes comparing the characteristic value with the reference value, and determining that the memory area is defective when the characteristic value is larger than the reference value.

Example embodiments provide that determining whether the memory area is defective includes, comparing the characteristic value with a value obtained by multiplying the reference value by N, and determining that the memory area is defective when the characteristic value is larger than the value obtained by multiplying the reference value by N.

Example embodiments provide that the method further includes receiving a control signal from outside of the non-volatile memory device, and setting at least one of the reference value and N according to the control signal.

Example embodiments provide that determining the first value includes, calculating the second value based on a sum obtained by adding together the plurality of program loop frequencies which correspond to the number N of word lines, the number N word lines being disposed at regular intervals from among the plurality of word lines.

Example embodiments provide that determining the first value includes, calculating the first value based on a sum obtained by adding together the plurality of program loop frequencies which correspond to the number N of word lines, the number N word lines being randomly selected from the plurality of word lines.

Example embodiments provide that the method further includes outputting a signal which indicates that the memory area is defective in response to the determining that the memory area is defective.

Example embodiments provide that the non-volatile memory device is a NAND flash memory device, and that the memory area is a memory block.

Example embodiments provide that the non-volatile memory device includes a test unit, and the method may be performed by the test unit in the non-volatile memory device.

Example embodiments provide that determining whether the memory area is defective includes determining that one of the plurality of word lines has a high program loop frequency relative to the plurality of program loop frequencies.

At least one example embodiment relates to a method of managing a non-volatile memory device.

According to another example embodiment, a method of managing a non-volatile memory device is provided. The non-volatile memory device includes a memory area. The memory area includes memory cells that are connected to a plurality of word lines. The method includes setting a reference value to be compared to the characteristic value of the memory area. The method includes transmitting, by the memory controller, the reference value to the non-volatile memory device. A characteristic value is calculated based on a first value and a second value. The first value is selected from a plurality of program loop frequencies corresponding to the plurality of word lines. The second value is calculated based on a number N of the plurality of program loop frequencies, where N is a natural number that is equal to or greater than two Example embodiments provide that the method further includes transmitting a test initiation signal to the non-volatile memory device to begin a test of the memory area of the non-volatile memory device, receiving a defective area signal, the defective area signal indicating that at least one portion of the memory area is defective, and adding an address of the at least one portion of the memory area to an unusable memory area list based on the received defective area signal.

Example embodiments provide that the method further includes transmitting a control signal for changing a value of N.

Example embodiments provide that the memory controller and the non-volatile memory device are included in a non-volatile memory system.

Another example embodiment relates to a method of testing a flash memory device to determine whether a memory area of the flash memory device is defective.

According to an example embodiment, a method of testing a flash memory device is provided. The flash memory device includes a memory block. The memory block includes a plurality of pages, each of which includes memory cells that are connected to a word line. The method includes selecting one of a plurality of program loop frequencies as a first value. The plurality of program loop frequencies corresponding to the plurality of pages. The method includes determining a second value based on a number N of the plurality of program loop frequencies, where the number N is a natural number that is equal to or greater than two. The method includes determining a characteristic value of the memory block based on the first value and the second value. The method includes determining whether the memory block is defective based on a reference value and the characteristic value.

Example embodiments provide that the first value is a maximum frequency from among the plurality of program loop frequencies, and the second value is a sum obtained by adding together the number N of the plurality of program loop frequencies.

BRIEF DESCRIPTION OF THE DRAWINGS

The example embodiments will be more clearly understood from the following detailed description taken in conjunction with the accompanying drawings in which.

DETAILED DESCRIPTION

Figure 1:
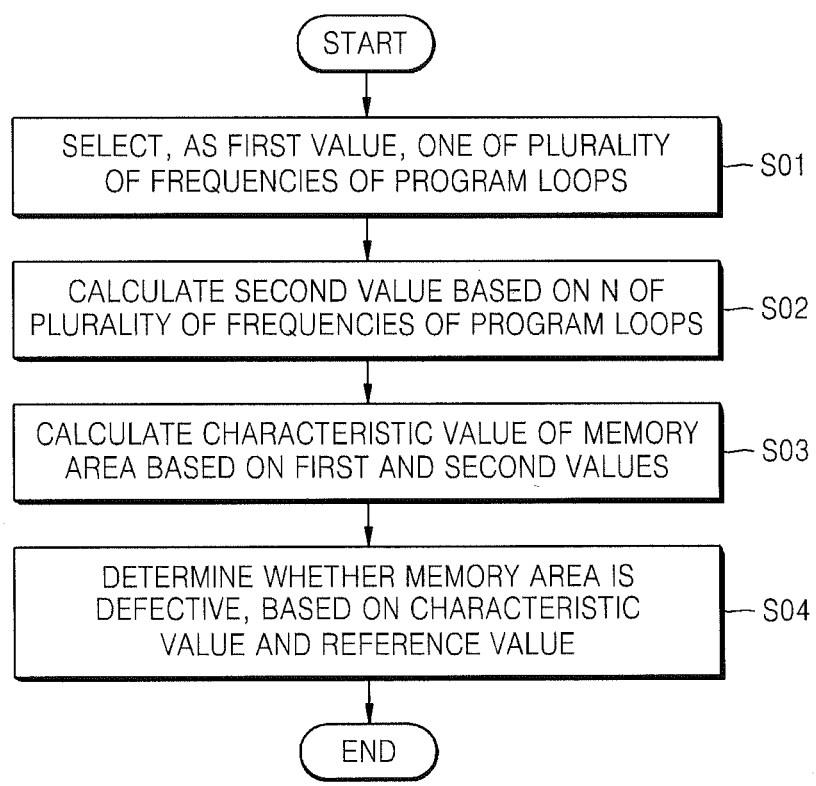
FIG. 1 is a flowchart illustrating a method of testing a non-volatile memory device, according to an example embodiment.

Hereinafter, example embodiments will be described in detail with reference to the accompanying drawings. However, the example embodiments may be embodied in many different forms and should not be construed as being limited to the example embodiments set forth herein. Rather, these example embodiments are provided so that this disclosure will be thorough and complete, and will fully convey the concept of the invention to those skilled in the art. Like reference numerals refer to like constitutional elements throughout the drawings.

As used herein, the term "and/or" includes any and all combinations of one or more of the associated listed items. Expressions such as "at least one of," when preceding a list of elements, modify the entire list of elements and do not modify the individual elements of the list.

It will be understood that, although the terms 'first', 'second', 'third', etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings. For example, a first element may be designated as a second element, and similarly, a second element may be designated as a first element without departing from the teachings.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

FIG. 1 is a flowchart illustrating a method of testing a non-volatile memory device, according to an example embodiment. The non-volatile memory device may include a cell array having a plurality of memory areas. By using the method to test a memory area included in the cell array, it may be determined whether the memory area is defective. A defective memory area includes a memory cell to which data is not normally written or from which data is not normally read, and may result due to various factors involved in the manufacture of the non-volatile memory device.

Each memory area may include a plurality of memory cells connected to a plurality of word lines, and each memory cell may be programmed by a voltage applied to a word line. In order to program a memory cell, an operation of applying a variable voltage to a word line and applying a verification operation to the memory cell may be repeatedly performed. That is, memory cells connected to a word line may be programmed through a "program loop" that may be repeatedly performed and/or executed. For example, a flash memory device that belongs to a non-volatile memory device may program a memory cell thereof by using an incremental step pulse programming (ISPP). Hereinafter, the terms "frequency of program loops" and "program loop frequency" may mean a number of times a program loop is performed and/or executed. In order for a memory cell included in a defective memory area to be programmed, a higher frequency of program loops may be required in comparison to the frequency of program loops required to program a memory cell included in a normal memory area.

As shown in operation S01, the non-volatile memory device selects, as a first value, one of the plurality of program loop frequencies. In various embodiments, the non-volatile memory device may count a plurality of program loop frequencies corresponding to a plurality of word lines included in a single memory area, and may select, as a first value, one of the plurality of program loop frequencies. For example, the first value may be any one of the plurality of program loop frequencies corresponding to all word lines included in the single memory area.

As shown in operation S02, the non-volatile memory device calculates a second value based on a number N of the plurality of program loop frequencies. In various embodiments, N corresponds to N word lines of the plurality of word lines included in the single memory area, where N is a natural number that is equal to or greater than two. When N is equal to the number of word lines included in the single memory area, the second value may be calculated based on all of the program loop frequencies corresponding to all the word lines included in the single memory area. When N is less than the number of word lines included in the single memory area, the second value may be calculated based on some of the program loop frequencies corresponding to all the word lines included in the single memory area.

As shown in operation S03, the non-volatile memory device calculates a characteristic value of the memory area based on the first and second values. The characteristic value is a numerical value indicating the state of the memory area, and may be used for determining whether the memory area is defective. By calculating the characteristic value of the memory area based on the second value calculated based on the first value, which is one of the plurality of program loop frequencies, and the second value calculated based on N of the plurality of program loop frequencies, the determination of whether the memory area is defective may be less influenced by the deviation of a manufacturing process of the non-volatile memory device.

As shown in operation S04, the non-volatile memory device may determine whether the memory area is defective, based on the characteristic value and a reference value. For example, the non-volatile memory device may compare the characteristic value with the reference value, and may determine whether the memory area is defective, based on the comparison result. Also, the non-volatile memory device may transmit a signal, which indicates whether the memory area is defective, to the outside of the non-volatile memory device, e.g., to a memory controller.

Figure 2:
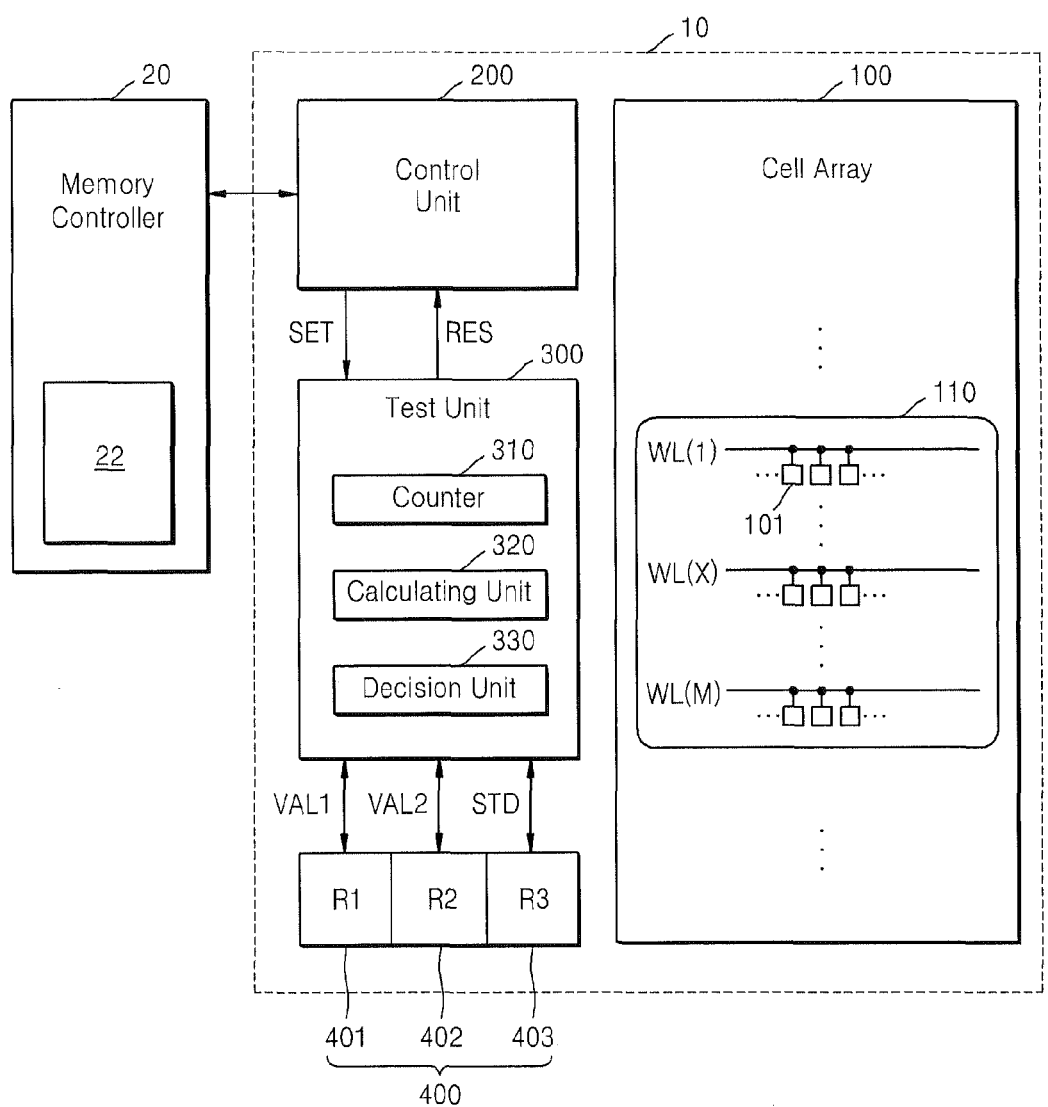
FIG. 2 is a schematic block diagram of a non-volatile memory device according to an example embodiment.

FIG. 2 is a schematic block diagram of a non-volatile memory device 10 according to an example embodiment. The non-volatile memory device 10 may communicate with a memory controller 20. For example, the memory controller 20 may transmit command signals and address signals to the non-volatile memory device 10, and may transmit or receive data signals to or from the non-volatile memory device 10. The non-volatile memory device 10 is a storage device that maintains data stored therein even when a power supply is no longer provided. The non-volatile memory device 10 may be a flash memory device, magnetic random access memory (MRAM), resistance RAM (RRAM), ferroelectric RAM (FRAM), phase change memory (PCM), and/or the like. Although the non-volatile memory device 10 is described below as a flash memory device, the example embodiments are not limited thereto.

As illustrated in FIG. 2, the non-volatile memory device 10 may include a cell array 100, a control unit 200, a test unit 300, and a register unit 400. The cell array 100 may include a plurality of memory cells storing data. A single memory cell 101 is a unit for storing data in the non-volatile memory device 10, and the size of data that is stored in the single memory cell 101 may be determined according to the type of the memory cell 101. For example, the memory cell 101 may be a single level cell (SLC), a multi-level cell (MLC), a triple level cell (TLC), a quadruple level cell (QLC), or the like. The SLC, the MLC, the TLC, and the QLC may store 1 bit data, 2 bit data, 3 bit data, and 4 bit data, respectively.

As illustrated in FIG. 2, the memory cell 101 may be connected to a single word line WL. The single word line WL may be connected to a plurality of memory cells, and a cell array 100 may include a plurality of word lines. The cell array 100 may be formed of at least one memory area 110, and the at least one memory area 110 may include memory cells 101 connected to the plurality of word lines. For example, as illustrated in FIG. 2, the memory area 110 may include memory cells 101 connected to M word lines WL(1) through WL(M) (where M is a natural number that is equal to or greater than 2).

In example embodiments where the non-volatile memory device 10 is a flash memory device, a write operation may be performed by a "unit of page", whereas an erase operation may be performed by a "unit of block" that is larger than the unit of page. The unit of page may be the size of data corresponding to memory cells connected to a single word line WL, and the unit of block may be the size of data corresponding to a plurality of pages or a set of memory cells that are simultaneously erased. The memory area 110 may be a single block or a plurality of adjacent blocks, and may include memory cells 101 connected to the M word lines WL(1) through WL(M) as illustrated in FIG. 2.

The control unit 200 may control elements included in the non-volatile memory device 10, and may transmit or receive signals to or from the memory controller 20 outside the nonvolatile memory device 10. The control unit 200 may transmit a reference value STD or a signal SET for setting N described with reference to FIG. 1 to the test unit 300, based on a signal received from the memory controller 20. The test unit 300 may store the reference value STD in a third register 300 of the register unit 400 or set N, according to the signal SET received from the control unit 200. In addition, the control unit 200 may receive a signal RES depending on whether the memory area 110 is defective, from the test unit 300, and may transmit a signal, which indicates whether the memory area 110 is defective, to the memory controller 20 based on the received signal RES.

The test unit 300 may test the memory area 110 included in the cell array 100. For example, the test unit 300 may test the memory area 110 based on program loop frequencies corresponding to the word lines WL(1) through WL(M) included in the memory area 110. As illustrated in FIG. 2, the test unit 300 may include a counter 310, a calculating unit 320, and a decision unit 330. The counter 310 may count the number of times of operations of programming and verifying memory cells connected to one of the word lines WL(1) through WL(M) of the memory area 110, that is, the frequency of program loops. The calculating unit 320 may calculate first and second values VAL1 and VAL2 based on an output signal of the counter 310, and may respectively store the first and second values VAL1 and VAL2 in first and second registers 401 and 402 included in the register unit 400. The decision unit 330 may calculate a characteristic value based on the first and second values VAL1 and VAL2 respectively stored in the first and second registers 401 and 402, and may determine whether the memory area 110 is defective, based on the calculated characteristic value and the reference value STD stored in the third register 403.

As illustrated in FIG. 2, the memory controller 20 may include an information storage unit 22. As described above, the memory controller 20 may receive a signal which indicates whether the memory area 110 is defective, from the non-volatile memory device 10. When the memory area 110 is defective or otherwise unreliable, the memory controller 20 may add the memory area 110 to an unusable memory area list. For example, the memory controller 20 may store an index or address of a memory area determined as a defective memory area in the information storage unit 22. According to data stored in the information storage unit 22, the memory controller 20 may not use the defective memory area of the non-volatile memory device 10.

Figure 3:
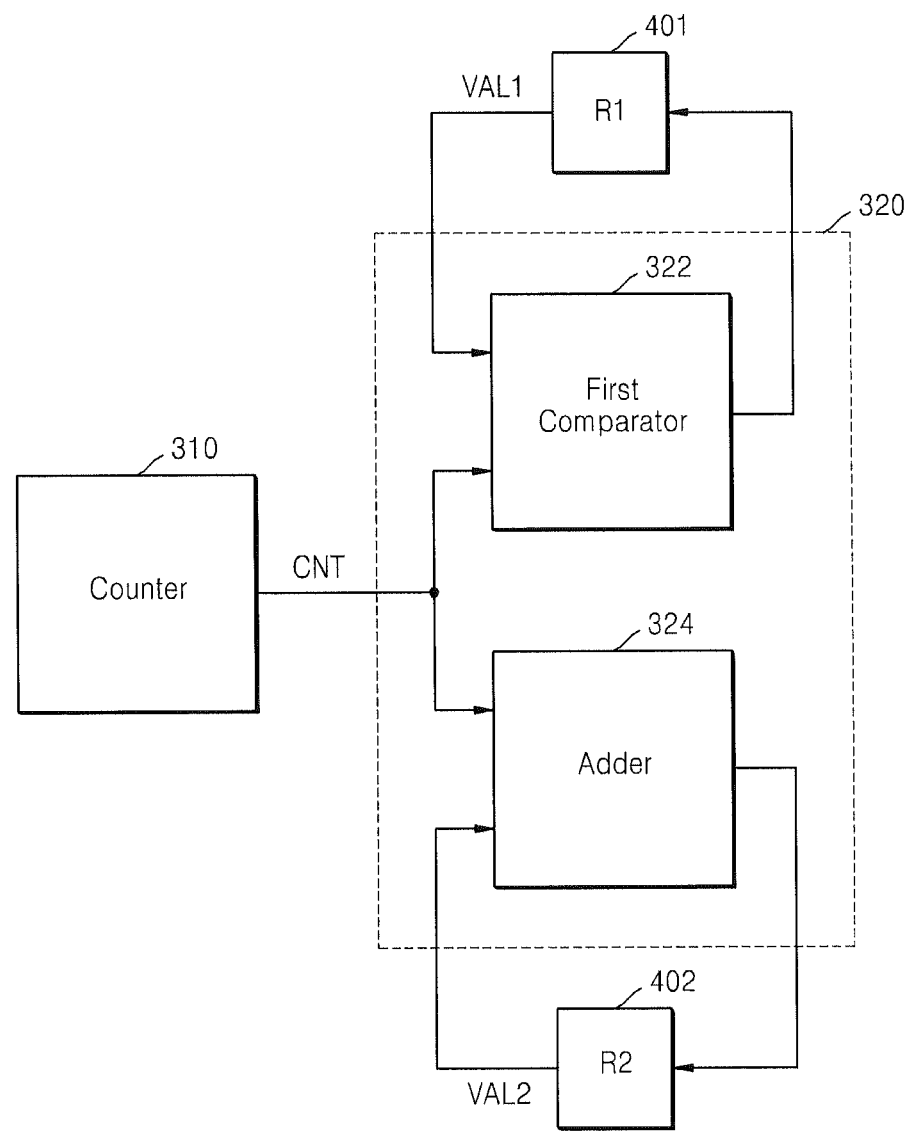
FIG. 3 is a schematic block diagram illustrating an implementation of a calculating unit of FIG. 2, according to an example embodiment.

FIG. 3 is a schematic block diagram illustrating an implementation example of the calculating unit 320 of FIG. 2, according to an example embodiment. As illustrated in FIG. 3, the counter 310 may transmit a signal CNT obtained by counting the frequency of program loops for memory cells connected to a single word line WL to the calculating unit 320. The counter 310 may output the signal CNT obtained by counting the frequency of program loops with respect to each of the word lines WL(1) through WL(M) of the memory area 110.

As described with reference to FIG. 2, the calculating unit 320 may receive the signal CNT output from the counter 310 and may calculate the first and second values VAL1 and VAL 2. The calculating unit 320 may include a first comparator 322 and an adder 324. The first comparator 322 and the adder 324 may receive the signal CNT output from the counter 310, and may calculate the first and second values VAL1 and VAL 2, respectively.

As illustrated in FIG. 3, the first comparator 322 may compare the value of the output signal CNT of the counter 310 with the first value VAL1 stored in the first register 401 (denoted as "R1" in FIG. 3), and may output the larger of the value of the output signal CNT and the first value VAL1. For example, when the value of the output signal CNT of the counter 310 is larger than the first value VAL1 stored in the first register 401, the first comparator 322 may output the output signal CNT of the counter 310, and the output signal CNT of the counter 310, which is output from the first comparator 322, may be stored in the first register 401. That is, the first value VAL1 stored in the first register 401 may be replaced with the output signal CNT of the counter 310. When the output signal CNT of the counter 310 is smaller than the first value VAL1 stored in the first register 401, the comparator 322 may output the first value VAL1 stored in the first register 401 to overwrite the output first value into the first register 401, or may control the first register 401 so that the first register 401 maintains the first value VAL1. When the counter 310 and the first comparator 322 perform the above-described operations with respect to all the word lines WL(1) through WL(M) of the memory area 110, the first register 401 may store, as the first value VAL1, a maximum frequency (hereinafter, referred to as "maximum value") selected from among the program loop frequencies corresponding to the word lines WL(1) through WL(M). That is, the first value VAL1 may be the highest frequency selected from among the program loop frequencies corresponding to the word lines WL(1) through WL(M) in the memory area 110.

As illustrated in FIG. 3, the adder 324 may add the output signal CNT of the counter 310 to the second value VAL2 stored in the second register 402 (denoted as "R2" in FIG. 3). The adder 324 may store a value obtained by adding the output signal CNT of the counter 310 to the second value VAL2 in the second register 402. The adder 324 may add N of signals that are output from the counter 310. That is, the adder 324 may selectively add the signal CNT output from the counter 310 to the second value VAL2 stored in the second register 402. When the counter 310 and the adder 324 perform the above-described operation with respect to all the word lines WL(1) through WL(M) of the memory area 110, the second register 402 may store, as the second value VAL2, a sum obtained by adding together N of the program loop frequencies corresponding to the word lines WL(1) through WL(M). The second value VAL2 may be a subtotal of the program loop frequencies corresponding to the word lines WL(1) through WL(M) of the memory area 110. A method of selecting N program loop frequencies is described below.

Figure 4A:
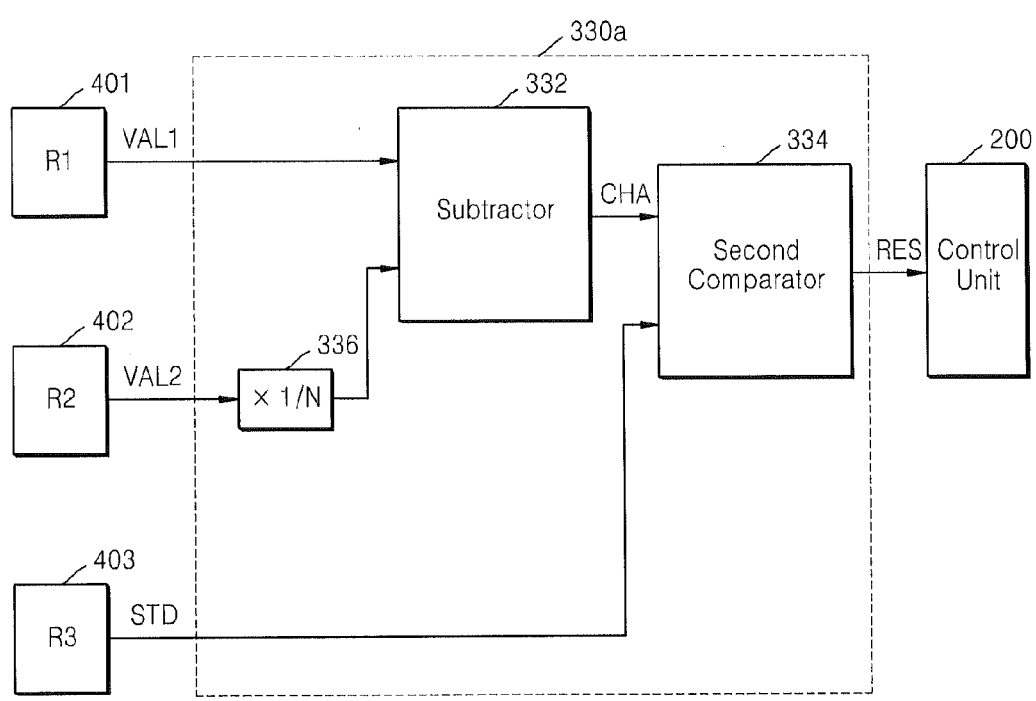
FIGS. 4A and 4B are schematic block diagrams illustrating implementation of a decision unit of FIG. 2, according to an example embodiment.
Figure 4B:
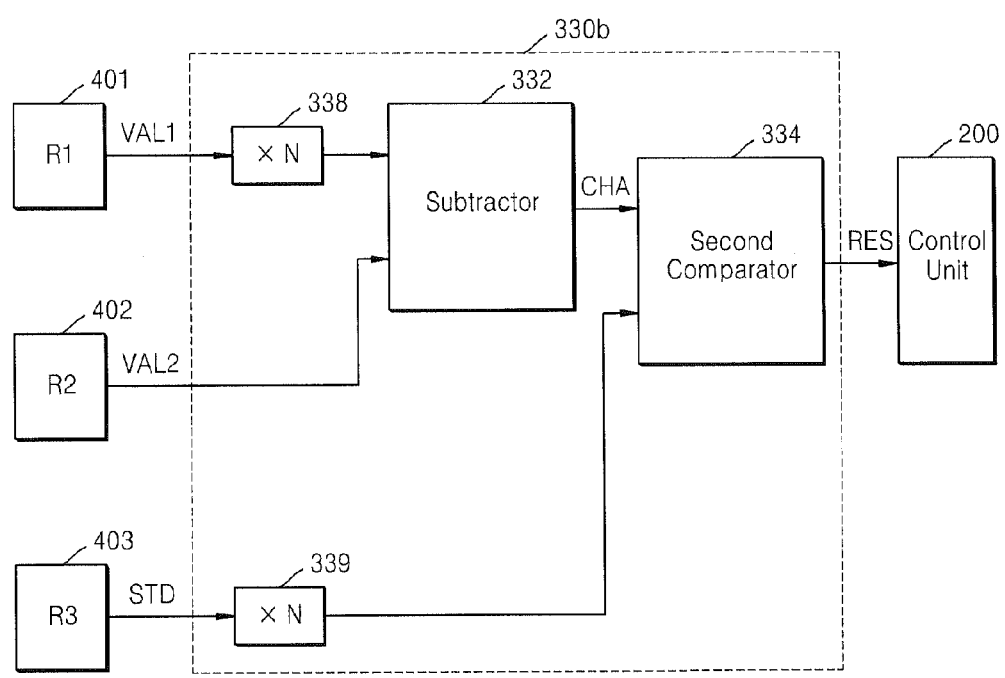

FIGS. 4A and 4B are schematic block diagrams illustrating implementation examples of the decision unit 330 of FIG. 2 according to an example embodiment. Referring to FIG. 2, the decision unit 330 may determine whether the memory area 110 is defective, based on the first value VAL1, the second value VAL2, and the reference value STD stored in the first, second, and third registers 401, 402, and 403, respectively. The decision unit 330 may transmit the signal RES, which indicates whether the memory area 110 is defective, to the control unit 200.

In the embodiment illustrated in FIG. 4A, a decision unit 330a may include a subtractor 332, a second comparator 334, and a divider 336. Referring to FIG. 3, the first value VAL1 stored in the first register 401 may be a maximum value selected from among the program loop frequencies of the memory area 110, and the second value VAL2 stored in the second register 402 may be a subtotal of the program loop frequencies (i.e., a sum obtained by adding together N program loop frequencies) of the memory area 110.

The divider 336 may output a quotient obtained by dividing the second value VAL2 stored in the second register 402 by N. That is, the divider 336 may output an average frequency (hereinafter, referred to as "average value") of N program loop frequencies. According to the current example embodiment, the divider 336 may output a quotient obtained by dividing an approximation of the second value VAL2 by N. For example, the divider 336 may shift the second value VAL2 in the direction of a least significant bit (LSB) thereof and output a shifted value. In particular, when N is $2^x$, the divider 336 may shift the second value VAL2 by x bits in the direction of the LSB and output a shifted value.

The subtractor 332 may subtract a value output from the divider 336 from the first value VAL1 to output a characteristic value CHA. Since the first value VAL1 may be the maximum value selected from among the program loop frequencies of the memory area 110 and the divider 336 outputs the average value of N program loop frequencies, the characteristic value CHA may be a difference value between the maximum value and the average value.

In the memory area 110, a word line having an abnormally high frequency of program loops may cause an error when writing data to a memory cell connected to the word line as well as when reading data stored in the memory cell. The high frequency of program loops of the word line may be caused by a high resistance value due to a defect occurring in the word line or a bridge and coupling between word lines. Thus, the maximum value selected from among the program loop frequencies in the memory area 110 may be used for determining whether the memory area 110 is defective.

A process of manufacturing the non-volatile memory device 10 may have an influence on the memory area 110. Characteristics of the non-volatile memory device 10 or characteristics of the memory area 110 included in the non-volatile memory device 10 may be influenced by a variation of the manufacturing process. Thus, according to example embodiments, the average of the program loop frequencies of the memory area 110 may be used to determine whether the memory area 110 is defective, in consideration of an effect due to the process variation. In various embodiments, the average may be an average frequency of program loops based on the program loop frequencies corresponding to all word lines. In some embodiments, the average may be an average frequency of program loops based on the program loop frequencies corresponding to only some of the word lines to reduce the amount of calculation.

The second comparator 334 may compare the characteristic value CHA with the reference value STD stored in the third register 403. The reference value STD stored in the third register 403 may be set from the outside of the non-volatile memory device 10. When the characteristic value CHA is larger than (or is equal to or larger than) the reference value STD, the second comparator 334 may output the signal RES indicating that the memory area 110 is defective or otherwise unreliable. Whether the memory area 110 is defective may be determined based on whether the maximum value is higher than the average value of the program loop frequencies of the memory area 110. As illustrated in FIG. 4A, the signal RES output from the second comparator 334 may be transmitted to the control unit 200, and the control unit 220 may output a signal, which indicates whether the memory area 110 is defective or otherwise unreliable, to the outside of the non-volatile memory device 10 based on the signal RES received from the second comparator 334.

The reference value STD may be set in consideration of the characteristic value CHA corresponding to a difference between the maximum value selected from among the program loop frequencies and the average value of the program loop frequencies. By calculating the characteristic value CHA as described above, the reference value STD may be set independent of the process variation. Thus, the memory area 110 may be tested on a relatively strict basis (i.e., a relatively low reference value STD), and as a result, a yield and quality of the non-volatile memory device 10 including the memory area 110 may be improved.

In the example embodiment illustrated in FIG. 4B, a decision unit 330b may include a subtractor 332, a second comparator 334, a first multiplier 338, and a second multiplier 339. Referring to FIG. 3, the first value VAL1 stored in the first register 401 may be a maximum value selected from among the program loop frequencies of the memory area 110, and the second value VAL2 stored in the second register 402 may be a subtotal of the program loop frequencies (a sum obtained by adding together N program loop frequencies) of the memory area 110.

The first multiplier 338 may output a value obtained by multiplying the first value VAL1 stored in the first register 401 by N, and the second multiplier 339 may output a value obtained by multiplying the reference value STD stored in the third register 403 by N. Before the subtractor 332 calculates a difference between the first value VAL1, which is the maximum value selected from among the program loop frequencies, and the second value VAL2 which is a sum obtained by adding together N of the program loop frequencies, the first multiplier 338 may multiply the first value VAL1 by N. Before the second multiplier 334 compares the characteristic value CHA with the reference value STD, the second multiplier 339 may multiply the reference value STD by N. The first multiplier 338 may shift the first value VAL1 in the direction of a most significant bit (MSB) thereof and output a shifted value, and the second multiplier 339 may shift the reference value STD in the direction of the MSB and output a shifted value. In particular, when N is $2^x$, the first multiplier 338 may shift the first value VAL1 by x bits in the direction of the MSB to output a shifted first value and the second multiplier 339 may shift the reference value STD by x bits in the direction of the MSB to output a shifted reference value.

The subtractor 332 may subtract the second value VAL2 output from the second register 402 from the value obtained by multiplying the first value VAL1 by N and output a characteristic value CHA. The subtractor 332 may output a difference value between a value corresponding to N times the maximum value selected from among the program loop frequencies and the sum obtained by adding together N of the program loop frequencies, as the characteristic value CHA.

The second comparator 334 may compare the characteristic value CHA with the value obtained by multiplying the reference value STD by N. When the characteristic value CHA is equal to or larger than the value obtained by multiplying the reference value STD by N, the second comparator 334 may output a signal RES indicating that the memory area 110 is defective. Whether the memory area 110 is defective may be determined based on whether the value corresponding to N times the maximum value is higher than the sum obtained by adding together N of the program loop frequencies. As illustrated in FIG. 4B, the signal RES output from the second comparator 334 may be transmitted to the control unit 200, and the control unit 220 may output a signal regarding whether the memory area 110 is defective to the outside of the nonvolatile memory device 10 based on the signal RES received from the second comparator 334.

The second multiplier 339 may be omitted. For example, the reference value STD may be comparable to N times a frequency of program loops, and may be stored in the third register 403. By storing a value in the third register 403 in correspondence with a value which would otherwise be output by the second multiplier 339, the second multiplier 339 may be omitted from the decision unit 330a.

Figure 5:
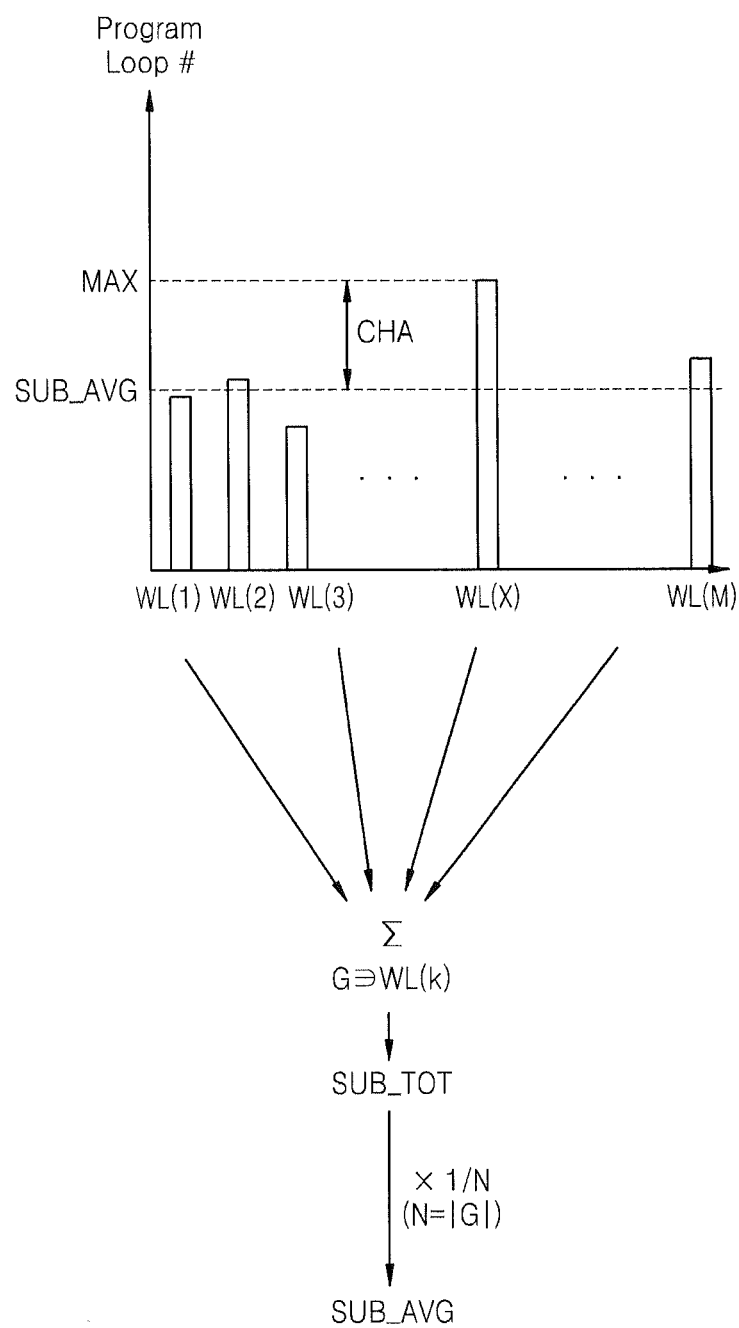
FIG. 5 is a diagram schematically illustrating a method of calculating a characteristic value, according to an example embodiment.

FIG. 5 is a diagram schematically illustrating a method of calculating a characteristic value, according to an example embodiment. Referring to FIGS. 2 and 5, each of the word lines WL(1) through WL(M) of the memory area 110 may require a specific frequency of program loops in order to successfully store data. According to the current example embodiment, the non-volatile memory device 10 may find a maximum value MAX from among the program loop frequencies corresponding to the word lines WL(1) through WL(M). Also, the non-volatile memory device 10 may calculate a subtotal SUB_TOT of the program loop frequencies. The subtotal SUB_TOT may be a sum obtained by adding together N of the program loop frequencies. The subtotal SUB_TOT may be a total frequency of program loops among all of the word lines belonging to a subgroup G from among the word lines WL(1) through WL(M). The subgroup G may include all of the word lines WL(1) through WL(M) of the memory area 110 or may include some of the word lines WL(1) through WL(M). For example, the subgroup G may include N word lines disposed at regular intervals from among the word lines WL(1) through WL(M) of the memory area 110 or N word lines randomly selected from among the word lines WL(1) through WL(M). The non-volatile memory device 10 may calculate an average value SUB_AVG from the subtotal SUB_TOT. The non-volatile memory device 10 may calculate the characteristic value CHA by subtracting the average value SUB_AVG from the maximum value MAX.

Figure 6A:
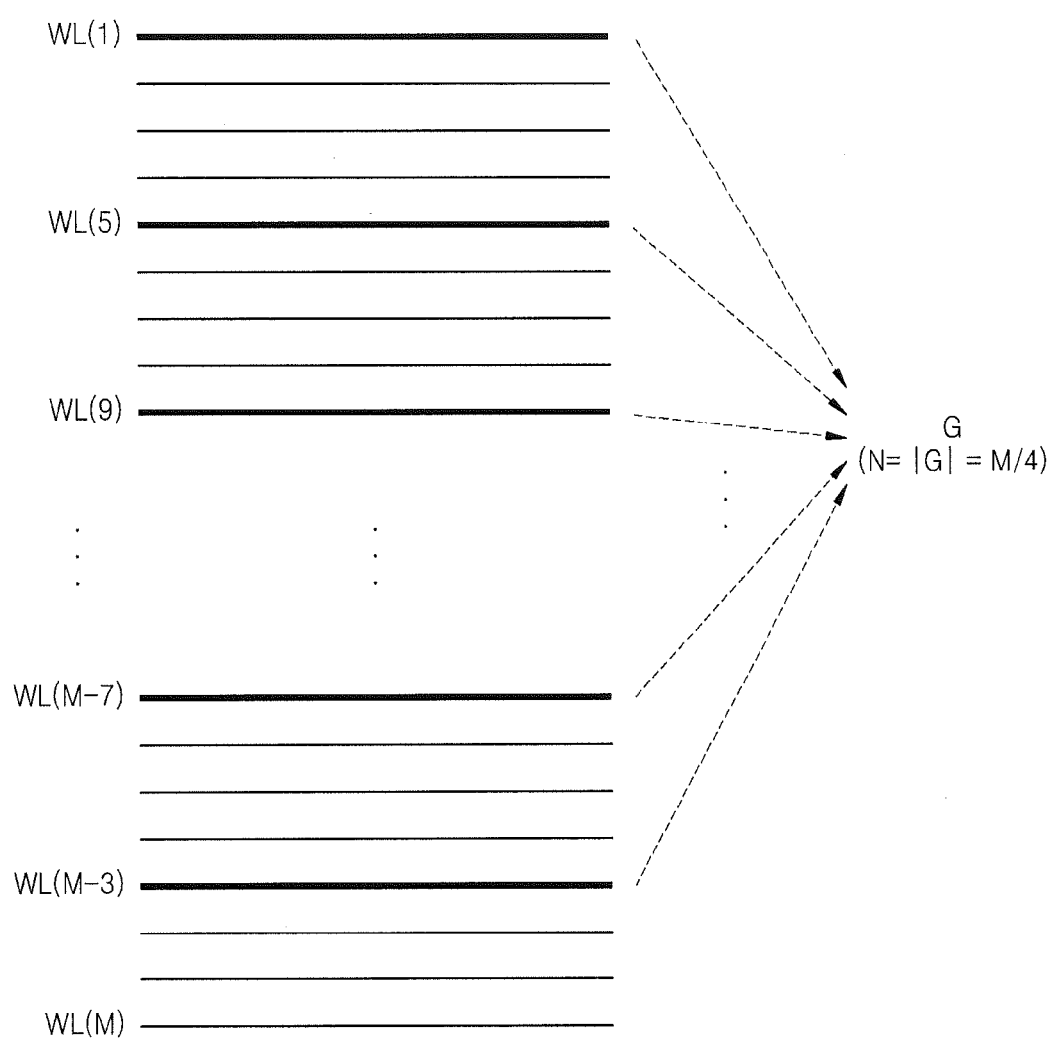
FIGS. 6A and 6B are diagrams illustrating examples of a subgroup G of FIG. 5, according to example embodiments.
Figure 6B:
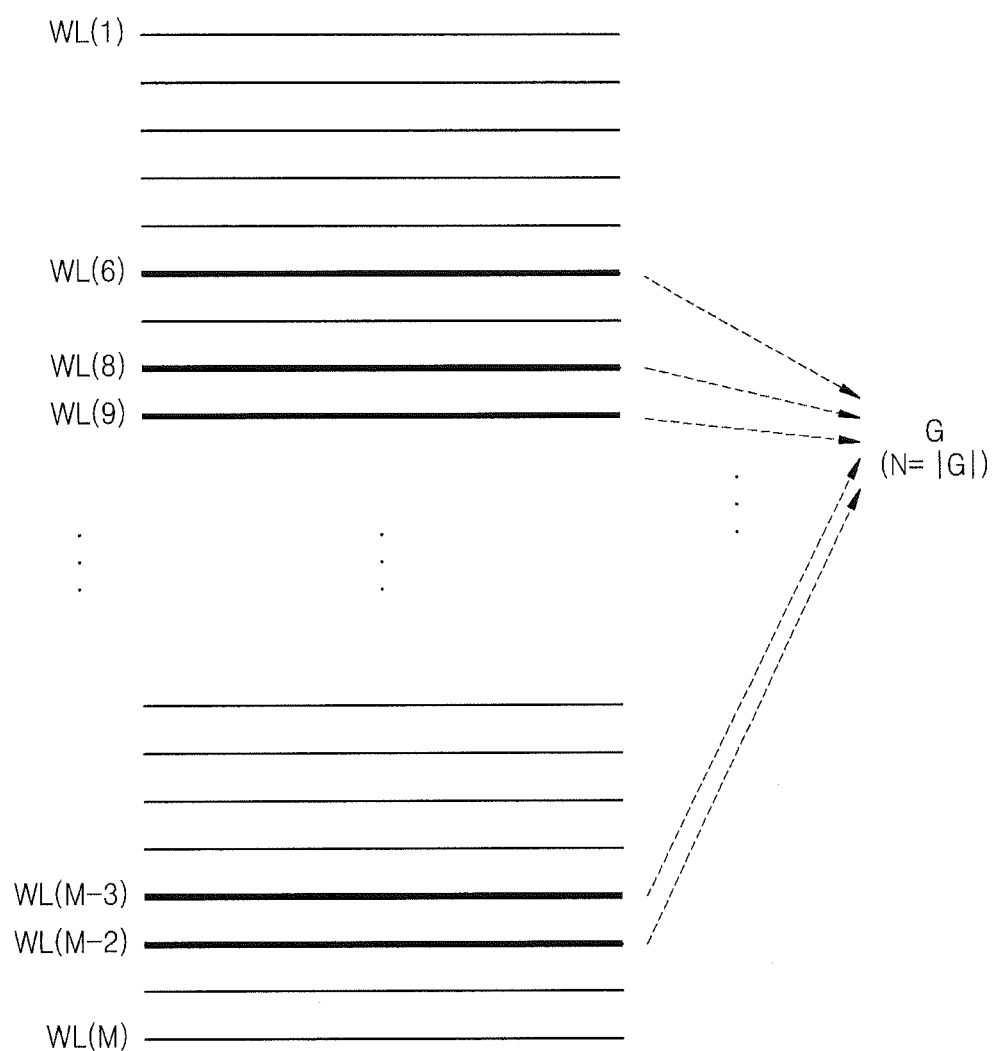

FIGS. 6A and 6B are diagrams illustrating examples of the subgroup G of FIG. 5, according to example embodiments. According to various example embodiments, the second value VAL2 may be the subtotal SUB_TOT of the program loop frequencies, and the subtotal SUB_TOT may be a sum obtained by adding together N of the program loop frequencies.

As illustrated in FIG. 6A, the sum obtained by adding together N of the program loop frequencies may be a sum obtained by adding together the program loop frequencies corresponding to N word lines disposed at regular intervals from among the word lines of the memory area 110. The memory area 110 may include M word lines WL(1) through WL(M), and the subgroup G of FIG. 5 may include M/4 word lines disposed at regular intervals. As illustrated in FIG. 6B, the sum obtained by adding together N of the program loop frequencies may be a sum obtained by adding together the program loop frequencies corresponding to N word lines randomly selected from among the word lines of the memory area 110.

Figure 7:
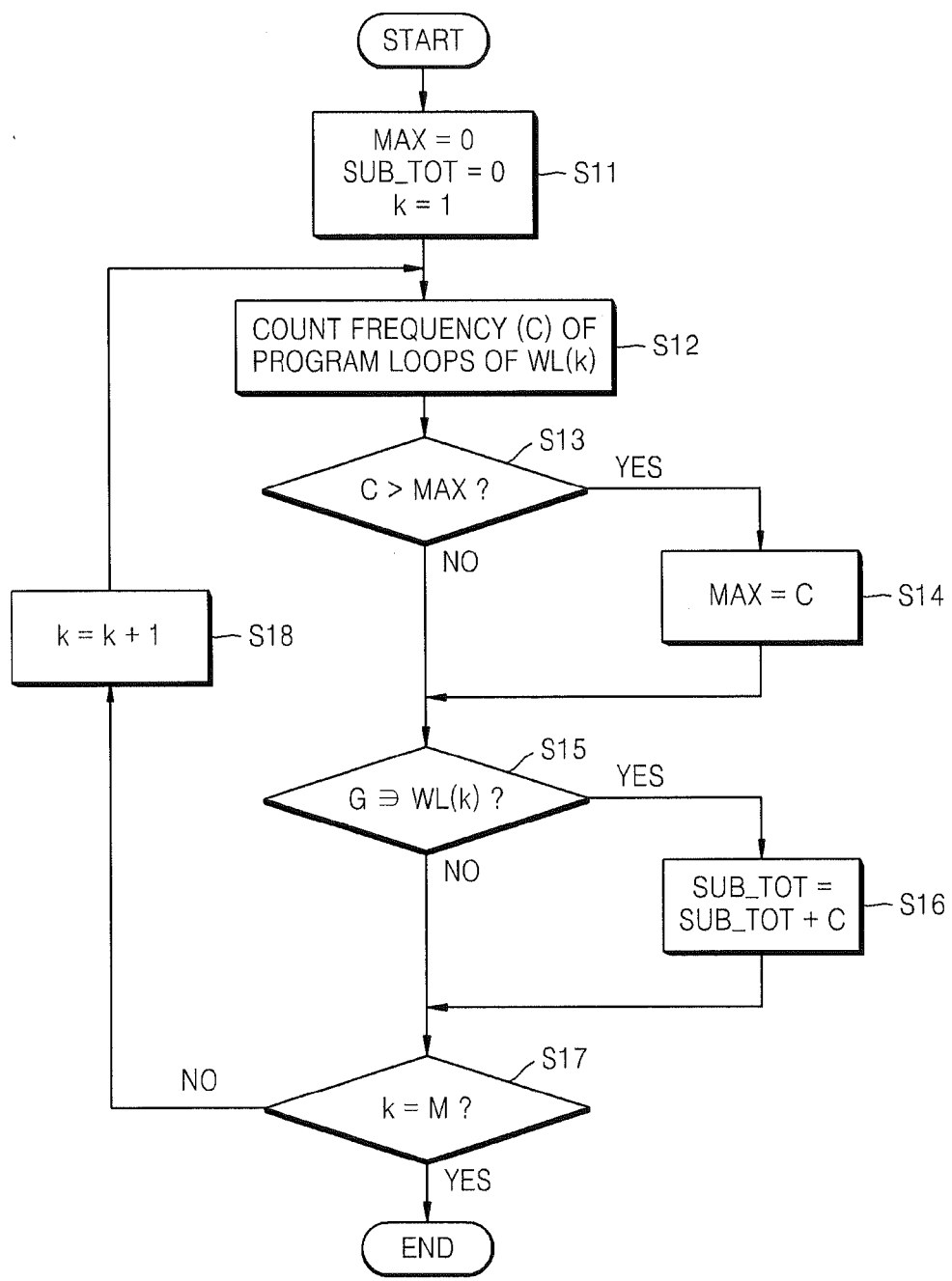
FIG. 7 is a flowchart illustrating a method of calculating first and second values, according to an example embodiment.

FIG. 7 is a flowchart illustrating a method of calculating the first and second values VAL1 and VAL2, according to an example embodiment. According to various example embodiment, the first value VAL1 may be a maximum value MAX selected from among the program loop frequencies of the memory area 110, and the second value VAL2 may be a sum SUB_TOT obtained by adding together N of the program loop frequencies.

As shown in operation S11, the non-volatile memory device 10 determines if a maximum value MAX equals zero (0), subtotal SUB_TOT equals zero (0), and the variable k equals one (1). Referring to FIGS. 2 and 3, the test unit 300 of the non-volatile memory device 10 may be initialized to determine whether the memory area 110 is defective. For example, as illustrated in FIG. 7, the maximum value MAX and the sum SUB_TOT may be set to "0", and a variable k for counting word lines may be set to "1". Thus, the first and second registers 401 and 402 may store "0".

As shown in operation S12, the non-volatile memory device 10 counts count the frequency C of program loops of word line WL(k). In various embodiments, the counter 310 of the tester unit 300 may count the frequency C of program loops of word line WL(k) and may output the frequency C of program loops (operation S12). For example, in order to write data "0" to memory cells connected to the word lines WL(k) by using the ISPP, the counter 310 may count the frequency C of program loops (i.e., the number of times of program loops) that a program and verification operation is performed.

As shown in operation S13, the non-volatile memory device 10 if the frequency C of program loops is greater than the maximum value MAX. The first comparator 322 may compare the frequency C of program loops with the maximum value MAX (operation S13).

As shown in operation S14, if the frequency C of program loops of the word line WL(k) is larger than the maximum value MAX, the maximum value MAX may be replaced with the frequency C of program loops.

As shown in operation S15, the adder 324 may determine whether the word line WL(k) is included in the subgroup G. If the word line WL(k) is included in the subgroup G, the frequency C of program loops may be added to the sum SUB_TOT as shown in operation S16.

As shown in operation S 17, the test unit 300 may determine whether a process of calculating the maximum value MAX or the sum SUB_TOT has been performed with respect to all the word lines WL(1) through WL(k) of the memory area 110. The test unit 300 may determine whether the variable k for counting word lines is M (i.e., the total number of word lines). If the variable k is M, the test unit 300 may end the process of calculating the maximum value MAX or the sum SUB_TOT. Otherwise, as shown in operation S18, the test unit 300 may increase the variable k by "1", and as shown in operation S12, the counter 310 may count the frequency C of program loops of a next word line WL(k).

Unlike the example embodiment illustrated in FIG. 7, the operations S15 and S16 of selectively calculating the sum SUB_TOT may be performed prior to or simultaneously in parallel with the operations S13 and S14 of calculating and updating the maximum value MAX.

Figure 8A:
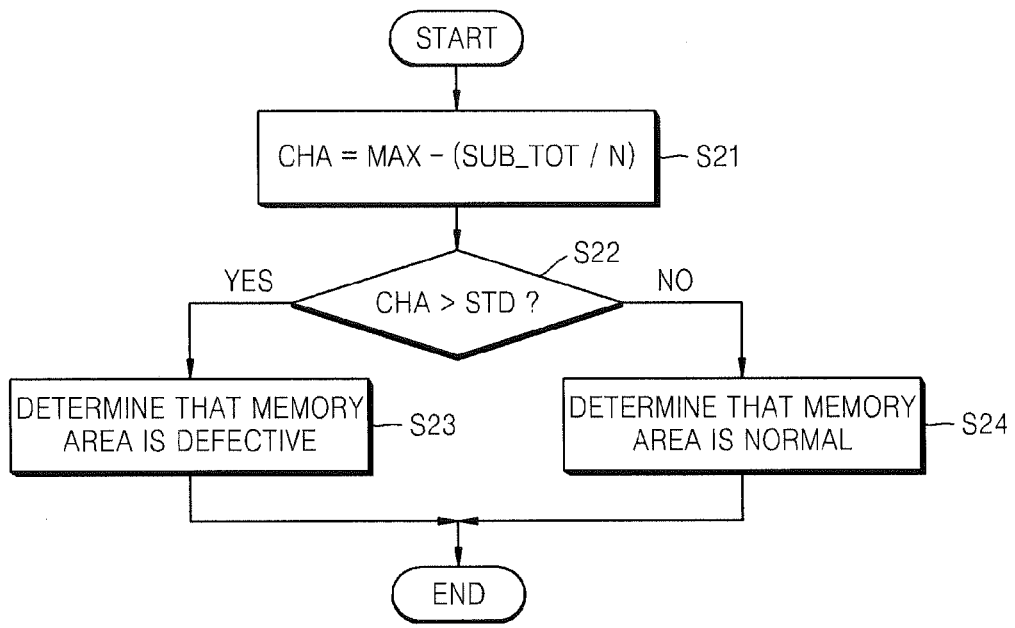
FIGS. 8A and 8B are flowcharts schematically illustrating methods of determining whether a memory area is defective, according to example embodiments.
Figure 8B:
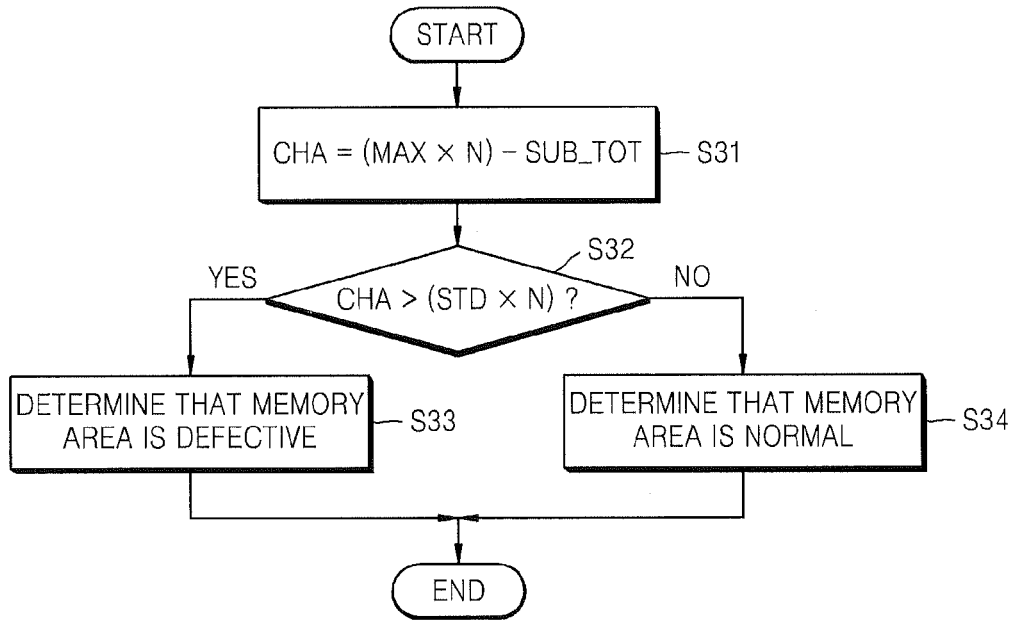

FIGS. 8A and 8B are flowcharts schematically illustrating methods of determining whether a memory area is defective, according to an example embodiment. FIG. 8A may correspond to the embodiment illustrated in FIG. 4A, and FIG. 8B may correspond to the embodiment illustrated in FIG. 4B. Referring to FIGS. 8A and 8B and FIG. 2, the decision unit 330 may calculate the characteristic value CHA based on the first value VAL1, the second value VAL2, and the reference value STD which are stored in the first register 401, the second register 402, and the third register 403, respectively, and may determine whether the memory area 110 is defective, based on the characteristic value CHA. In FIGS. 8A and 8B, the first value VAL1 may be a maximum value MAX selected from among the program loop frequencies and the second value VAL2 may be a sum SUB_TOT obtained by adding together N of the program loop frequencies.

FIG. 8A is a flowchart illustrating a method of determining whether a memory area is defective, according to the embodiment illustrated in FIG. 4A. Referring to FIG. 8A and FIG. 4A, as shown in operation S21, the subtractor 332 of the decision unit 330a may calculate the characteristic value CHA by subtracting a quotient obtained by dividing the sum SUB_TOT by N from the maximum value MAX. As shown in operation S22, the second comparator 334 of the decision unit 330a may compare the characteristic value CHA with the reference value STD. When the characteristic value CHA is larger than the reference value STD, the decision unit 330a indicates that the memory area 110 is defective as shown in operation S23. Otherwise, as shown in operation S24, the decision unit 330a indicates that the memory area 110 is normal. That is, the second comparator 334 may compare the characteristic value CHA with the reference value STD and may output the signal RES, which indicates that the memory area 110 is defective, when the characteristic value CHA is larger than the reference value STD.

FIG. 8B is a flowchart illustrating a method of determining whether a memory area is defective, according to the embodiment illustrated in FIG. 4B. Referring to FIG. 8B and FIG. 4B, as shown in operation S31, the subtractor 332 of the decision unit 330b may calculate the characteristic value CHA by subtracting the sum SUB_TOT from a value obtained by multiplying the maximum value MAX by N. As shown in operation S32, the second comparator 334 of the decision unit 330b may compare the characteristic value CHA with a value obtained by multiplying the reference value STD by N. When the characteristic value CHA is larger than the value obtained by multiplying the reference value STD by N, the decision unit 330b indicates that the memory area 110 is defective as shown in operation S33. Otherwise, as shown in operation S34, the decision unit 330b indicates that the memory area 110 is normal. The second comparator 334 may compare the characteristic value CHA with the value obtained by multiplying the reference value STD by N, and may output the signal RES, which indicates that the memory area 110 is defective, when the characteristic value CHA is larger than the value obtained by multiplying the reference value STD by N.

Figure 9:
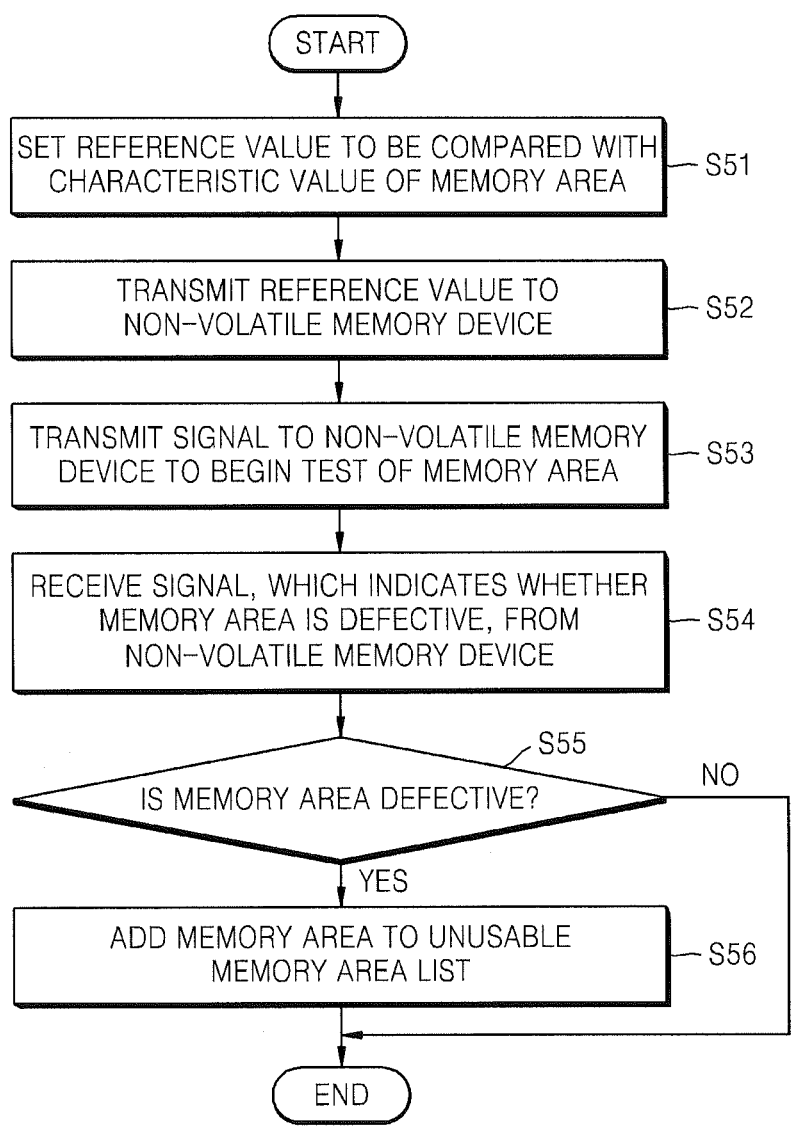
FIG. 9 is a flowchart illustrating a method of managing a non-volatile memory device, according to an example embodiment.

FIG. 9 is a flowchart illustrating a method of managing a non-volatile memory device, according to an example embodiment. Referring to FIG. 9 and FIG. 2, the memory controller 20 may communicate with the non-volatile memory device 10, and may control or manage the non-volatile memory device 10. For example, the memory controller 20 may transmit commands, addresses, and data to the nonvolatile memory device 10 to write the data to the non-volatile memory device 10. Also, the memory controller 20 may receive a signal, which indicates whether the memory area 110 is defective, from the non-volatile memory device 10, and may manage the non-volatile memory device 10 based on the signal.

Referring to FIG. 9 and FIG. 2, as shown in operation S51, the memory controller 20 may set the reference value STD to be compared with the characteristic value CHA of the memory area 110. As described above, the characteristic value CHA of the non-volatile memory device 10 may be calculated based on the first and second values VAL1 and VAL2, and thus, the memory controller 20 may set the reference value STD in consideration of the first and second values VAL1 and VAL2. For example, when the first value VAL1 is a maximum value selected from among the program loop frequencies which word lines of the memory area 110 have and the second value VAL2 is a sum obtained by adding together N of the program loop frequencies, the memory controller 20 may set the reference value STD in consideration of the maximum value and the sum. As described above, the memory controller 20 may set the reference value STD independently of a process variation by considering the sum obtained by adding together N of the program loop frequencies.

As shown in operation S52, the memory controller 20 may transmit the set reference value STD to the non-volatile memory device 10. The control unit 200 of the non-volatile memory device 10 may receive the reference value STD from the memory controller 20, and the test unit 300 may receive the received reference value STD from the control unit 200 and may store it in the third register R3.

As shown in operation S53, the memory controller 20 may transmit a signal starting up a test of the memory area 110 to the non-volatile memory device 10. The control unit 200 of the non-volatile memory device 10 may issue a command to the test unit 300 so that the test unit 300 may start the test of the memory area 110.

As shown in operation S54, the memory controller 20 may receive a signal, which indicates whether the memory area 110 is defective, from the non-volatile memory device 10. The test unit 300 of the non-volatile memory device 10 may test the memory area 110 and may transmit the signal RES, which indicates whether the memory area 110 is defective, to the control unit 200, and the memory controller 20 may receive a signal which depends on the indication by the signal RES from the control unit 200.

As shown in operation S55, the memory controller 20 may determine whether the memory area 110 is defective, based on the signal received from the non-volatile memory device 10. When the memory area 100 is defective, the memory controller 20 may add the memory area 110 to an unusable memory area list as shown in operation S56. For example, the memory controller 20 may store an index or address of the defective memory area 110 in the information storage unit 22 of the memory controller 20. The memory controller 20 may not use a defective memory area included in the non-volatile memory device 10, based on the index or address stored in the information storage unit 22.

Figure 10:
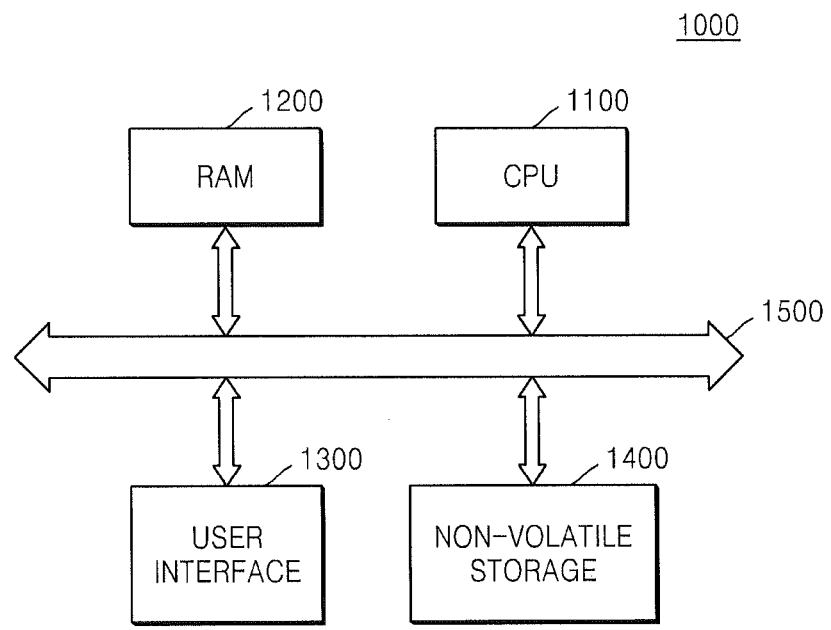
FIG. 10 is a block diagram of a computing system having a non-volatile memory system mounted therein, according to an example embodiment.

FIG. 10 is a block diagram of a computing system 1000 having a non-volatile memory system mounted therein, according to an example embodiment. A non-volatile memory system according to any one of the example embodiments may be mounted as a non-volatile storage device 1400 in the computing system 1000, such as a mobile device or a desktop computer.

The computing system 1000 may include a central processing unit (CPU) 1100, a RAM 1200, a user interface 1300, and the non-volatile storage device 1400 that are electrically connected to each other via a bus 1500. A non-volatile memory device included in the non-volatile storage device 1400 may be a NAND flash memory, a NOR flash memory, an MRAM, an RRAM, an FRAM, a PCM, or the like.

As in the example embodiments described above, the non-volatile storage device 1400 may include a memory controller and a non-volatile memory device. The non-volatile memory device may include a test unit that may test a memory area included in a memory cell array. The test unit may calculate a characteristic value of a memory area based on first and second values derived from the program loop frequencies corresponding to word lines of the memory area. The test unit may compare the characteristic value with a reference value to determine whether the memory area is defective, and may transmit a signal, which indicates whether the memory area is defective, to the outside of the non-volatile memory device (that is, to the memory controller) via a control unit. The memory controller may set the reference value and may transmit the set reference value to the non-volatile memory device, and may manage the non-volatile memory device based on information about whether the memory area is defective.

Figure 11:
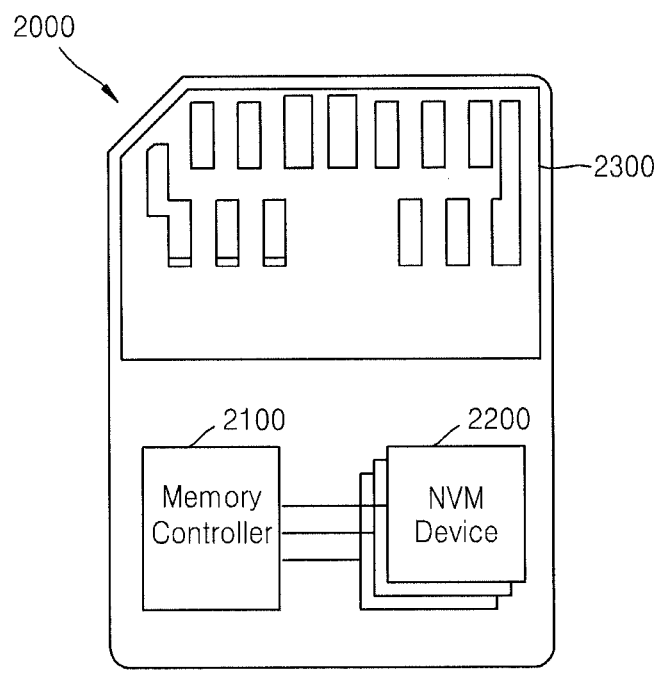
FIG. 11 is a diagram illustrating a memory card according to an example embodiment.

FIG. 11 is a diagram illustrating a memory card 2000 according to an example embodiment. A non-volatile memory system according to any one of example embodiments may be implemented as the memory card 2000. The memory card 2000 may be a portable storage device that may be used by connecting it to an electronic device, such as a mobile device or a desktop computer. As shown in FIG. 11, the memory card 2000 may include a memory controller 2100, a non-volatile memory device 2200, and a port area 2300. For example, the memory card 2000 may be a multimedia card (MMC), an embedded multimedia card (eMMC), a secure digital (SD) card, or the like.

The memory controller 2100 may communicate with an external host via the port area 2300, and may control the non-volatile memory device 2200. As in the embodiments described above, the non-volatile memory device 2200 may include a memory cell array, a control unit, a test unit, and a register unit. The test unit may calculate a characteristic value of a memory area according to a first value selected from among the program loop frequencies of the memory area and a second value obtained based on a sum obtained by adding together N of the program loop frequencies. The test unit may compare the characteristic value with a reference value set by the memory controller 2100 to determine whether the memory area is defective. The memory controller 2100 may store data, which depends on whether the memory area is defective, in an information storage unit, and may manage the non-volatile memory device 2200 based on the data stored in the information storage unit.

While the example embodiments have been particularly shown and described, it will be understood that various changes in form and details may be made therein without departing from the spirit and scope of the following claims.

What is claimed is:

1. A method of testing a non-volatile memory device, the non-volatile memory device including a memory area, the memory area including memory cells that are connected to a plurality of word lines, the method comprising:
    selecting, by the non-volatile memory device, one of a plurality of program loop frequencies as a first value, the plurality of program loop frequencies corresponding to the plurality of word lines;
    determining, by the non-volatile memory device, a second value based on a number N of the plurality of program loop frequencies, where the number N is a natural number that is equal to or greater than two;
    determining, by the non-volatile memory device, a characteristic value of the memory area based on the first and second values; and
    determining, by the non-volatile memory device, whether the memory area is defective based on a reference value and the characteristic value.

2. The method of claim 1, wherein,
    the first value is a maximum frequency from among the plurality of program loop frequencies, and
    the second value is a sum obtained by adding together the number N of the plurality of program loop frequencies.

3. The method of claim 2, wherein the characteristic value is obtained by subtracting from the first value a quotient obtained by dividing the second value by the number N.

4. The method of claim 2, wherein the characteristic value is obtained by subtracting the second value from a value obtained by multiplying the first value by the number N.

5. The method of claim 1, wherein the reference value is based on the first value and the second value.

6. The method of claim 1, wherein the determining whether the memory area is defective comprises:
    comparing the characteristic value with the reference value; and
    determining that the memory area is defective when the characteristic value is larger than the reference value.

7. The method of claim 1, wherein determining whether the memory area is defective comprises:
    comparing the characteristic value with another value that is obtained by multiplying the reference value by the number N; and
    determining that the memory area is defective when the characteristic value is larger than the other value obtained by multiplying the reference value by the number N.

8. The method of claim 1, further comprising:
    receiving a control signal from outside of the non-volatile memory device; and
    setting at least one of the reference value and the number N according to the control signal.

9. The method of claim 1, wherein determining the second value comprises:
    calculating the second value based on a sum obtained by adding together the plurality of program loop frequencies which correspond to the number N word lines, the number N word lines being disposed at regular intervals from among the plurality of word lines.

10. The method of claim 1, wherein determining the first value comprises:
    calculating the first value based on a sum obtained by adding together the plurality of program loop frequencies which correspond to the number N word lines, the number N word lines being randomly selected from the plurality of word lines.

11. The method of claim 1, further comprising:
    outputting, by the non-volatile memory device, a signal which indicates that the memory area is defective in response to determining that the memory area is defective.

12. The method of claim 1, wherein,
    the non-volatile memory device is a NAND flash memory device, and
    the memory area is a memory block.

13. The method of claim 1, wherein, the non-volatile memory device includes a test unit, and the method is performed by the test unit.

14. The method of claim 1, wherein determining whether the memory area is defective comprises:
    determining that one of the plurality of word lines has a high program loop frequency relative to the plurality of program loop frequencies.

15. A method of managing a non-volatile memory device, the non-volatile memory device including a memory area, the memory area including memory cells that are connected to a plurality of word lines, the method comprising:
    setting, by a memory controller, a reference value to be compared to a characteristic value of the memory area; and
    transmitting, by the memory controller, the reference value to the non-volatile memory device,
    wherein a characteristic value is calculated based on a first value and a second value, the first value being selected from a plurality of program loop frequencies corresponding to the plurality of word lines, and the second value being calculated based on a number N of the plurality of program loop frequencies, where N is a natural number that is equal to or greater than two.

16. The method of claim 15, further comprising:
    transmitting a test initiation signal to the non-volatile memory device to begin a test of the memory area of the non-volatile memory device;
    receiving a defective area signal, the defective area signal indicating that at least one portion of the memory area is defective; and adding an address of the at least one portion of the memory area to an unusable memory area list based on the received defective area signal.

17. The method of claim 15, further comprising:
transmitting, to the non-volatile memory device, a control signal for changing a value of N.

18. The method of claim 15, wherein the memory controller and the non-volatile memory device are included in a non-volatile memory system.

19. A method of testing a flash memory device, the flash memory device including a memory block, the memory block including a plurality of pages each of which includes memory cells that are connected to a word line, the method comprising:
selecting, by the flash memory device, one of a plurality of program loop frequencies as a first value, the plurality of program loop frequencies corresponding to the plurality of pages;
determining, by the flash memory device, a second value based on a number N of the plurality of program loop frequencies, where the number N is a natural number that is equal to or greater than two;
determining, by the flash memory device, a characteristic value of the memory block based on the first value and the second value; and
determining, by the flash memory device, whether the memory block is defective based on a reference value and the characteristic value.

20. The method of claim 19, wherein,
the first value is a maximum frequency from among the plurality of program loop frequencies, and
the second value is a sum obtained by adding together the number N of the plurality of program loop frequencies.

* * * * *